United States Patent [19]

Yoshioka et al.

[11] Patent Number: 4,479,149
[45] Date of Patent: Oct. 23, 1984

[54] PHOTO-ELECTRIC CONVERTER AND IMAGE FORMING APPARATUS INCORPORATING THE SAME

[75] Inventors: Seishiro Yoshioka; Yutaka Hirai, both of Tokyo; Tadaji Fukuda; Masaki Fukaya, both of Kawasaki; Takashi Nakagiri, Tokyo, all of Japan

[73] Assignee: Canon Kabushiki Kaisha, Tokyo, Japan

[21] Appl. No.: 160,160

[22] Filed: Jun. 17, 1980

[30] Foreign Application Priority Data

Jun. 25, 1979 [JP] Japan .................................. 54-79858

[51] Int. Cl.$^3$ .......................... H04N 1/02; H04N 1/10
[52] U.S. Cl. ..................................... 358/294; 358/293
[58] Field of Search ............................... 358/293–294, 358/285, 213; 250/211 R, 211 J

[56] References Cited

U.S. PATENT DOCUMENTS

| | | | |
|---|---|---|---|
| 3,544,713 | 12/1970 | Case | 358/294 |
| 4,149,197 | 4/1979 | Kos et al. | 358/294 |
| 4,189,753 | 2/1980 | Parsons et al. | 358/293 |
| 4,241,421 | 12/1980 | Burke et al. | 358/298 |
| 4,247,874 | 1/1981 | Kos et al. | 358/294 |
| 4,257,071 | 3/1981 | Lamb | 358/293 |
| 4,271,435 | 6/1981 | Takenouchi et al. | 358/294 |
| 4,305,100 | 12/1981 | Hattori | 358/293 |

Primary Examiner—Raymond F. Cardillo, Jr.
Attorney, Agent, or Firm—Fitzpatrick, Cella, Harper & Scinto

[57] ABSTRACT

A photo-electric converter principally constructed with a photo-electric conversion unit wherein m×n photo-electric conversion elements, each having a light receiving window to form a pel and constructed with a layer of light receiving body and two electrodes provided on both sides thereof, are arranged two-dimensionally in an array of m ranks and n files, and wherein the light receiving windows of the photo-electric conversion elements constituting a rank are arranged at an equally spaced pitch of an integral multiple of that of pels. A signal processing circuit processes and produces as an output a signal which has been subjected to the photo-electric conversion in the photo-electric conversion unit.

3 Claims, 15 Drawing Figures

PHOTO-ELECTRIC CONVERTER AND IMAGE FORMING APPARATUS INCORPORATING THE SAME

BACKGROUND OF THE INVENTION

1. Field of the Invention

This invention relates to a photo-electric converter to be adopted in a light information input device which is one of the constituent elements of an image forming apparatus, etc. to form an image by actuating a recording head (e.g. an ink jet head) constructed with a plurality of writing elements using image signals obtained by two-dimensional scanning of documents, papers, and other image originals.

2. Description of the Prior Arts

Remarkable development and progress have been attained recently in the field of the image forming apparatus such as a reproduction or duplicating apparatus, and so forth. Yet, there still remains various problems to be solved such as the increase in density densification in reading and writing of image information from and into the image forming apparatus, speed increase in such reading and writing operations, simplification of the signal processing system in the apparatus, and others. Take the increase in density in writing for example. The most general way of writing in such image forming apparatus has been to arrange a plurality of writing elements in one row or rank, and to move an array of the writing elements (recording head) in a direction orthogonal to the row of the writing elements, thereby performing the two-dimensional scanning. This way of writing, however, is difficult to implement when the spacing between the writing elements is greater than a desired pitch of writing picture element (pel). Even if an ink jet head is taken as an example of the recording head, the minimum spacing of discharge orifices of the ink jet head array is of an order of 0.25 mm or so, and hence a value of 4 pel/mm or so becomes the maximum recording pel density. With this writing density, however, the image resolution will fall short of the recording images of documents and papers in general, for which a pel density of at least 12 pel/mm is desired. Further, in accordance with the pel density, there arises the necessity for a reading apparatus capable of reading high density pel signals.

One way of attaining such purposes has been disclosed in a Japanese patent Laid-Open Publication No. 53-136835 (corresponding to U.S. Pat. No. 4,112,469). In this published application, the printer reads a document with a high density by an interlace system using a one-dimensional photo-sensor array with n photodiodes being arranged at a certain definite spacing, and performs high density recording in the same interlace system as the read-scanning using a print head constructed by arranging n nozzles with a certain definite spacing. Incidentally, for the entire document having a two-dimensional plane to be scanned with the one-dimensional photo-sensor array, it becomes necessary to provide a scanning optical system for moving a photo-sensor array image over the document in the direction perpendicular to the length of the array and along at least the width of the document. As will be readily understood, in the high speed recording a scanning optical system of very high scanning speed is demanded, which is not favorable from the technical standpoint. Accordingly, now that the technique in the two-dimensional photo-sensor array has been developed, it is desirable to remedy the above-mentioned defect by performing the read-scanning with use of the two-dimensional photo-sensor array. Accordingly, the following two main points should be taken into consideration as to the technique required.

The first point is to obtain a reading system which uses the two-dimensional photo-sensor array, and is capable of reading pel signals with a reading density in conformity with a desired writing density. Generally speaking, since the number of the reading pels accomplishing a desired writing density is far more than the number of the photo-sensor elements constituting the two-dimensional photo-sensor array, and since the photo-sensor element pitch cannot be made as small as the pitch of the pels, it becomes necessary to provide a device for reading the entire pels on the surface of the image original, while inserting an appropriate pitch therebetween. The method of insertion should further be convenient for the writing system. For instance, when the writing system of the printer as disclosed in the aforementioned Japanese patent Laid-Open Publication No. 53-136835 (corresponding to U.S. Pat. No. 4,112,469) is to be employed, it becomes necessary to provide a signal processing system which once stores therein pel signals to be obtained from the two-dimensional photo-sensor array, and then rearranges the pel signals for the interlace writing.

The second point is therefore to provide a device which adopts the image reading and writing system capable of simplifying the signal processing system.

SUMMARY OF THE INVENTION

The present invention is concerned with the above-described technical background, and is directed to an improved photo-electric converter.

It is therefore an object of the present invention to provide a photo-electric converter which realizes the reading system for obtaining high density pel signals, while making an insertion using a two-dimensional photo-sensor array.

It is another object of the present invention to provide a photo-electric converter capable of realizing an image forming apparatus, in which the reading and recording can be effected by direct connection with a writing device, without requiring particular memory means and signal rearranging means.

It is still another object of the present invention to provide a photo-electric converter, in which the photo-electric conversion elements are arranged two-dimensionally at a certain definite spacing, and in which size of the light receiving window for each photo-electric conversion element corresponds to the size of unit pel of the pels to be read.

It is yet another object of the present invention to provide a photo-electric converter, in which the light receiving member layer which is one of the principal component elements of the photo-electric conversion element in the two-dimensional photo-electric converter is formed by chemical or physical evaporative deposition of various photo-conductive materials such as hydrogenated amorphous silicon (hereinafter abbreviated as "α-Si:H"), Se, SeTe and PbO.

According to one aspect of the present invention, there is provided a photo-electric converter having a photo-electric conversion section, in which $m \times n$ (where m is in rank and n is in file) photo-electric conversion elements, each having a light receiving window to form a single pel, and being constructed with a layer of light receiving body and two electrodes provided on both sides of the light receiving body layer, are arranged two-dimensionally, and in which the light receiving windows of the photo-electric conversion elements constituting a rank are arranged at an equally spaced pitch of an integral multiple of that of pels, and a signal processing circuit section processes and produces as an output a signal which has been photo-electrically converted in the photo-electric conversion section.

According to another aspect of the present invention, there is provided an image forming apparatus which comprises: (a) photo-electric conversion means to photo-electrically convert a light signal bearing thereon image original information and to produce a corresponding electric signal the photo-electric conversion means being provided with a photo-electric conversion section, in which m×n (where m is in rank and n is in file) photo-electric conversion elements, each having a light receiving window to form a pel, and being constructed with a light receiving body layer and two electrodes provided on both sides of the light receiving body layer, are two-dimensionally arranged, and in which the light receiving windows of the photo-electric conversion elements constituting a rank are arranged at an equal interval pitch of an integral multiple of that of the pels; (b) an optical system for radiating light bearing the original image information onto the light receiving surface of the photo-electric conversion section; (c) a recording head wherein n recording elements are arranged in one row in correspondence to a rank of the light receiving windows of the photo-electric conversion elements in the photo-electric conversion section; (d) a drive system for driving the above-mentioned n recording elements mutually independently in response to a signal output from the photo-electric conversion means; (e) rotary supporting means to support a recording medium, which rotates for one pitch of a file of the light receiving windows of the photo-electric conversion elements in a recording period of time for one rank with the n recording elements; and (f) means for moving the above-mentioned recording head relatively parallel during one rotation of the rotary supporting means, for one pitch of a rank of the light receiving windows of the photo-electric conversion elements, and along and in parallel with a rotational shaft of the above-mentioned rotary supporting means.

BRIEF DESCRIPTION OF THE DRAWINGS

FIGS. 1A, 1B and 1C are schematic partial structural diagrams of one preferred embodiment of a photo-electric conversion section 100 which is the principal component part of the photo-electric converter in accordance with the present invention, in which

DESCRIPTION OF THE PREFERRED EMBODIMENTS

Figure 1A:
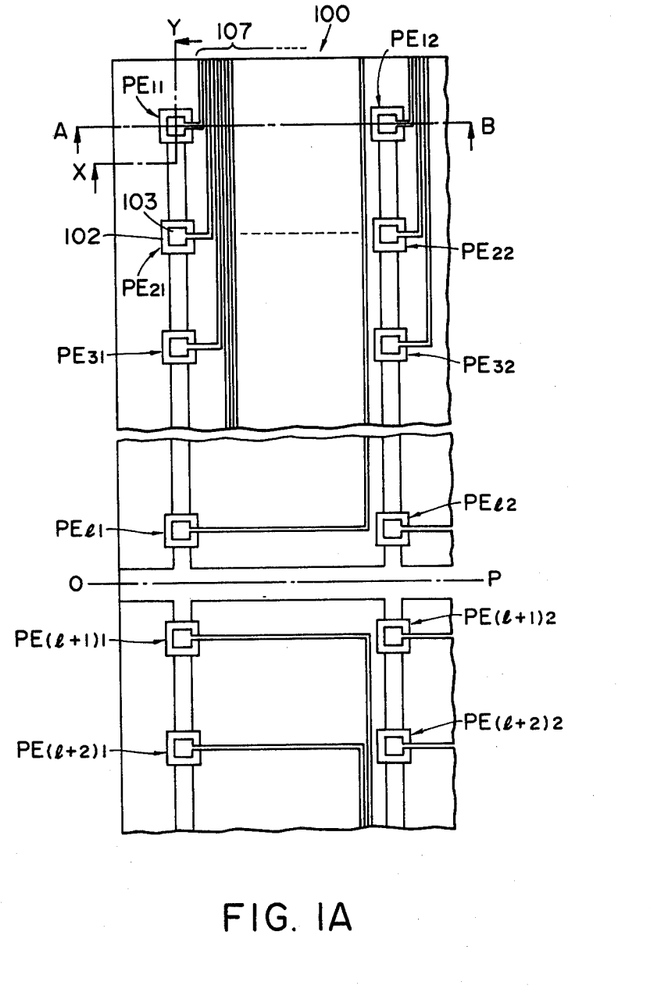
FIG. 1A is a partial plan view of the photo-electric conversion section.

FIG. 1A shows the photo-electric conversion section 100 which is the principal component part of the photo-electric converter according to the present invention. The photo-electric conversion section 100 has on its transparent substrate 101 such as transparent glass, transparent ceramics, etc., a predetermined number (m×n) of photo-electric conversion elements PE. Each of the photo-electric conversion elements PE is constructed with a layer of light receiving member 102, picture element, or pel, electrodes 103, each being provided on both sides of the light receiving member layer 102, and opposite electrode 104, and a light intercepting layer 106 provided for forming a light receiving window 105 having a predetermined area for the input light information to enter into the photo-electric conversion elements PE.

The photo-electric conversion elements PE, which are m×n in number, are so constructed that the light receiving windows 105 of the photo-electric conversion elements PE constituting the rank or row (e.g. $PE_{11}$, $PE_{12}$... as the first rank; $PE_{21}$, $PE_{22}$, ... as the second rank; $PE_{l1}$, $PE_{l2}$, ... as the lth rank, etc.) are arranged with an equal interval pitch of an integral multiple of one reading, and that a lead 107 connected with the pel electrode 103 of each photo-electric conversion element PE is led out between the files or columns of the photo-electric conversion elements PE constituting the file (e.g., $PE_{11}$, $PE_{21}$, $PE_{31}$, ..., $PE_{l1}$, ... as the first file; $PE_{12}$, $PE_{22}$, $PE_{32}$, ... $PE_{l2}$, ... as the second file) so that each photo-electric conversion element PE may be electrically connected with a predetermined circuit. The leads 107 are divided into two groups by the center line of the photo-electric conversion section 100 shown by a dot-and-dash line OP, and led out into opposite directions.

The opposite electrodes 104 are provided in a wet form for each file (column). The electrodes 104 on each file are gathered at the center position OP to be electrically connected in group, and have a pattern on the substrate 101 such as to be terminated as a single terminal.

The light intercepting layer 106 is provided on the substrate 101 at a position where the opposite electrode 104 is provided, with a width of the opposite electrode 104, and in a form, in which a portion forming the light receiving window 105 is removed. The opposite electrode 104 is also provided in such a manner that it may cover a portion of the above-mentioned light receiving window 105 on the light intercepting layer 106.

On the opposite electrode 104, there is provided the light receiving member layer 102 in a manner to cross over the opposite electrode 104 in the breadthwise direction thereof. The pel electrode 103 is provided at a position confronting the opposite electrode 104 on the surface of the light receiving member layer 102 (FIG. 1B).

Figure 1B:
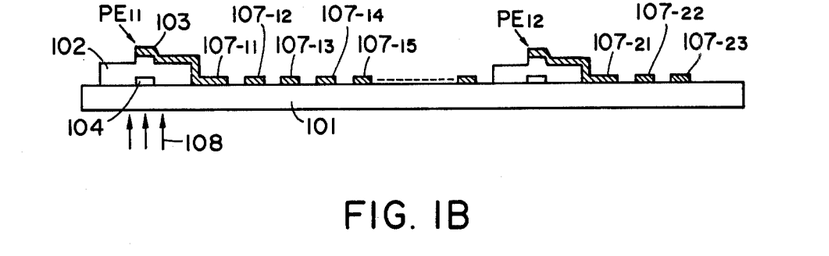
FIG. 1B is an enlarged side elevational view, in cross-section, of the photo-electric conversion section taken along a dot-and-dash line A—B in FIG. 1A.
Figure 1C:
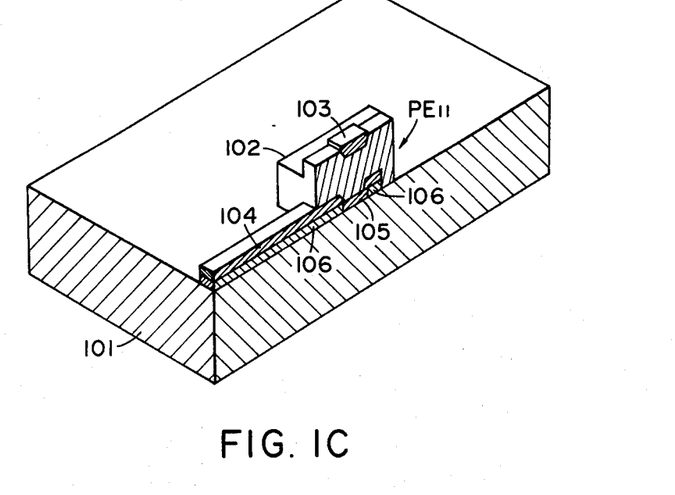
FIG. 1C is a perspective view, in an enlarged scale and partly in cross-section, of one portion of the photo-electric converter, taken along a dot-and-dash line X—Y in FIG. 1A.

The photo-electric conversion section 100 of the apparatus shown in FIGS. 1A, 1B and 1C is so constructed that light information 108 may be projected from the side of the substrate 101. In the present invention, however, it may be feasible to construct the photo-electric conversion section in such a manner that the light information may be projected from a side where the photo-electric conversion elements PE are provided.

The photo-electric conversion section 100 in the photo-electric converter according to the present invention is constructed, as shown in FIGS. 1A, 1B and 1C, by two-dimensionally arranging the photo-electric conversion elements PE, which are the component elements of the apparatus, so that the light receiving windows 105 may be arranged at an equal interval pitch of an integral multiple of that of pels of an image original bearing information to be read, and by disposing the lead 107 from the pel electrode 103 in each photo-electric conversion element PE between adjacent files (or columns). On account of this, the lead wires for the pel electrode 103 and the opposite electrode 104 do not become complicated in spite of a multitude of the photo-electric conversion elements PE being two-dimensionally disposed on the surface of the substrate 101. Further, since the entire wiring is planar, and can be accommodated in an ample space, productivity and mass-production of the photo-electric converter is remarkably satisfactory, and each photo-electric conversion element PE can be arranged with a precise pitch.

In the photo-electric converter shown in FIG. 1, the opposite electrode 104 is made common to all the photo-electric conversion elements PE constituting each file, and these opposite electrodes are commonly wired at the center position OP of the photo-electric conversion section 100 to be unified by connection with the outside, and the pel electrode 103, on the other hand, is connected the outside for each photo-electric conversion element PE. Besides this construction, the present invention can adopt the orthogonal matrix wiring as another method of arrangement of the pel electrode and the opposite electrode. In this case, the number of electrodes can be reduced to (m+n) from (m×n+1) of the photo-electric converter shown in FIG. 1, which is favorable.

In the following, process steps for manufacturing the photo-electric converter shown in FIG. 1 will be explained as one example of the manufacturing method of the two-dimensional photo-electric converter according to the present invention. First of all, a metal material such as chromium, etc., is deposited on a transparent base plate or substrate 101 made of glass, etc., by vacuum evaporation. After this, stripe patterns are formed on the metal coating by the photo-etching technique to constitute a light receiving window of a desired size, thereby obtaining a light intercepting layer 106. Next, an electrically conductive transparent coating is laminated on this stripe-patterned metal coating by vacuum evaporation. This electrically conductive transparent film, too, is subjected to stripe-patterning by the photo-etching technique to thereby form an opposite electrode 104. Subsequently, a layer of a light receiving member 102 is laminated on this opposite electrode 104 by means of physical or chemical evaporative deposition. This layer of the light receiving member is then subjected to spot-patterning by the photo-etching technique in the same manner as mentioned above. Finally, a metal film is laminated by the vacuum evaporation method to form an pel electrode 103 and a lead 107, which metal coating is then subjected to stripe-patterning by the photo-etching technique to thereby form a desired photo-electric conversion element PE. In this way, the two-dimensional photo-electric converter according to the present invention is manufactured.

The photo-electric converter according to the present invention is classified into the following four types depending on the state of a junction between the light receiving member layer consitituting the photo-electric conversion element and the two electrodes provided on both sides of the light receiving member layer:

(1) Schottky junction type,
(2) Hetero-junction type,
(3) Homo-junction type, and
(4) Hybrid type.

In the following, detailed explanations will be given in reference to FIGS. 2 to 8 showing several preferred examples of the actual construction of the photo-electric conversion element for the photo-electric conversion section, by which the remarkable characteristics of the present invention are exhibited for each of the above-mentioned four types.

Figure 2:
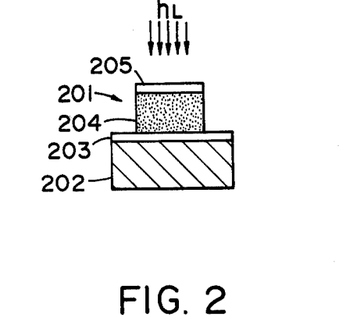
FIGS. 2 through 8 inclusive are schematic cross-sectional side views showing the construction of preferred embodiments of the photo-electric conversion element PE which constitutes the photo-electric conversion section of the photo-electric converter according to the present invention.

FIG. 2 illustrates a typical example of the Schottky junction type photo-electric conversion element 201. As seen from the drawing, the photo-electric conversion element 201 is configured such that the light receiving member layer 204 is provided on the surface of the electrode 203 formed on the substrate 202, and a further electrode 205 is provided on the top surface of the light receiving member layer 204.

The electrode 203 is in ohmic contact with the light receiving member layer 204, while the light receiving member layer 204 is in Schottky contact with the electrode 205.

In the photo-electric conversion element 201 of the type shown in FIG. 2, since the light information is projected onto the conversion element 201 from the side of the electrode 205, that electrode should be light-transmissive. When the light receiving member layer 204 is made of α-Si:H, and the substrate 202 is made of stainless steel, the ohmic contact can be formed without specifically providing the electrode 203, whereby the function of the electrode can be imposed upon the substrate per se.

Figure 3:
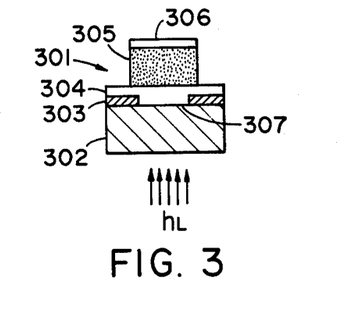

FIG. 3 also shows the Schottky junction type photo-electric conversion element, in which the light information is projected thereonto from the side of the substrate. The basic structure of this photo-electric conversion element is generally the same as that shown in FIG. 2 above with the exception that metal layers 303 non transmissive to light are provided between the substrate 302 and the electrode 304 to form the light receiving window 307, and the material to form every part of the structure is so selected that the electrode 304 and the light receiving member layer 305 form a Schottky junction, while the light receiving member layer 305 and the electrode 306 form an ohmic junction.

In the case of the photo-electric conversion element of the type as shown in FIG. 3, wherein the light information is projected from the side of the substrate 302, since the surface side of the original image to be scanned is to the side of the substrate 302 when the element is used as a reading device in a facsimile or a digital copier, the photo-electric conversion element 301 is protected from mechanical impairment caused thereto by scanning on the image original surface, which is convenient from the standpoint of device maintenance. Therefore, this type of photo-electric conversion element is the most suitable for the so-called contact type reading device, in which the read-scanning operation is carried out by bringing both the image original surface to be read and the light receiving surface of the photo-electric conversion section very close to one another.

Figure 4:
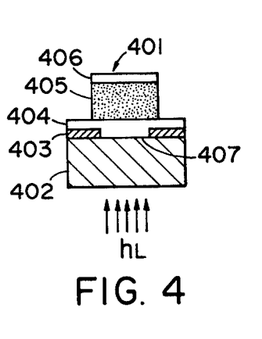
Figure 5:
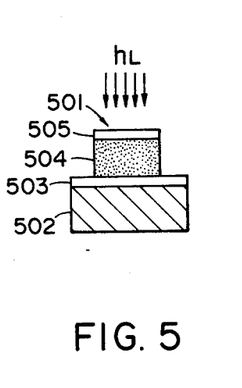

FIGS. 4 and 5 indicate the hetero-junction type of photo-electric conversion element, wherein the element in FIG. 4 is of a type, in which the light information is projected from the side of the substrate, while the element in FIG. 5 is of a type, in which the light information is projected from the side of the photo-electric conversion element.

The photo-electric conversion element 401 of the type shown in FIG. 4 is the optimum example among the preferred embodiments of the present invention. In the conversion element shown, a non-light-transmissive metal layer 403 is provided on the surface of the substrate 402 except for a region where the light receiving window 407 of the photo-electric conversion element 401 is formed, and then an electrode 404 is formed over this metal layer 403.

The film thickness and quality of the material forming the non-light-transmissive metal layer 403 and the electrode 404 should be determined in consideration of the mutual relationship between the metal layer and the electrode so that an optically desirable junction having satisfactory contact therebetween may be formed.

The light receiving member layer 405 to be formed on the electrode 404 is made of a material to constitute the hetero-junction with the electrode 404.

For example, when the electrode 404 is formed of SnO$_2$ or ITO (indium tin oxide), the layer 405 is formed of either non-doped α-Si:H or α-Si:H doped with a very small quantity of the Group V-A element in the Periodic Table. Alternatively, it may be formed of α-Si:H heavily doped with the element of the same group so that the electrode 404 may be rendered n+ type.

The electrode 406 to be formed on the light receiving member layer 4-5 is made of a material which renders the electrode to be in the ohmic contact with the light receiving member layer. For example, when the light receiving member layer 405 is formed on the material as mentioned in the foregoing, the material for the electrode may be appropriately selected from Nb, Ta, V, Ti, Cr, Mo, Al, stainless steel, and others.

Since the substrate 402 is oriented toward the side from which the light information is projected, the material is so selected that the light information may be projected into the light receiving window 407 of each photo-electric conversion element 401 with a predetermined optical characteristic. With such material, the processing and treatment are effected. In case the non-light-transmissive metal layer 403 and the electrode 404, and further the light receiving member layer 405, are formed on the substrate under a high temperature condition, the substrate 402 should be selected from those materials which are thermally stable. When the photo-electric conversion element is used for the contact type reading device, it is preferable that the substrate 402 be constructed with, for example, fiber plate, acute lens plate, and the like so that the projected light information will not be optically diffused on the substrate 402 causing a decrease in the image resolution.

The photo-electric conversion element shown in FIG. 5 is of the hetero-junction type, in which the light information is projected from the side of the photo-electric conversion element. The material for forming the electrode 503 and the light receiving member layer 504 should be so selected that the electrode 503 to be provided on the substrate 502 and the light receiving member layer 504 to be formed on the surface of the electrode 503 may form the ohmic contact therebetween. The hetero-junction is formed between the light receiving member layer 504 and the electrode 505.

In the above description with respect to the FIG. 5 embodiment, the other structural and manufacturing conditions for this particular embodiment are taken from those requirements as mentioned with reference to the FIGS. 2 to 4 embodiments. However, when the electrode 505 is made of a material workable at a high temperature in order for the hetero-junction to be formed at the interface between the electrode and the light receiving member layer 504, the light receiving member layer is protected from deleterious effects due to such heat by selection of a material therefor which does not lower its photo-electric or electric characteristic due to such thermal effect, or by selection of a material for the electrode 505, which is capable of forming the electrode at a low temperature.

Figure 6:
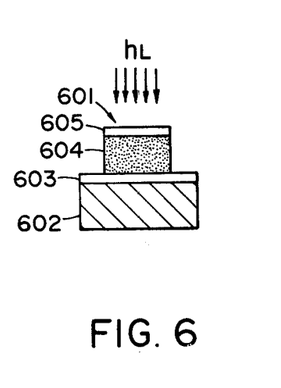

The photo-electric conversion element 601 of the type shown in FIG. 6 has a fundamental difference in construction from those types which have been explained in the foregoing. That is to say, the illustrated type of the photo-electric conversion element is of the homo-junction type, in which the light receiving member layer 604 constituting the photo-electric conversion element 601 contains in its layer structure the homo-junction.

The homo-junction within the layer of the light receiving member layer 604 may be formed with α-Si:H, for example, of which the conductivity-type can be controlled. In more detail, then the light receiving member layer 604 is formed by sequentially laminating a p-type α-Si:H layer and an n-type α-Si:H layer from the side of the electrode 603, there can be formed the p-n junction within the layer.

Besides the above, two homo-junctions may be formed within one and the same layer as in the case of the laminated layer structure consisting of i-type α-Si:H layer and p-type α-Si:H layer (or n-type α-Si:H layer), or of p-type α-Si:H layer, n-type α-Si:H layer, and p-type α-Si:H layer. Since such conductivity-type control can be easily attained by doping the above-mentioned impurities into the α-Si:H at the time of the layer formation, the light receiving member layer can be formed continuously.

The homo-junction to be formed in the light receiving member layer 604 should preferably be formed from the standpoint of photo-electric conversion efficiency, in the layer at a position in the vicinity of the incident side of the light information.

Figure 7:
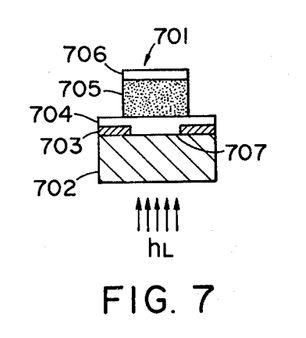

FIG. 7 shows the essentially identical structure with that of the photo-electric conversion element 601 shown in FIG. 6 with the exception that the position of the incident side of the light information differs from the previous embodiment. In the photo-electric conversion element 701 of FIG. 7, the non-light-transmissive metal layer 703 is interposed between the electrode 704 and the substrate 702 so as to form the light receiving window 707 of a predetermined size in order for the light information to be input from the side of the substrate 702. In other aspects, the same constituent material for the photo-electric conversion element 601 shown in FIG. 6 can be used.

Figure 8:
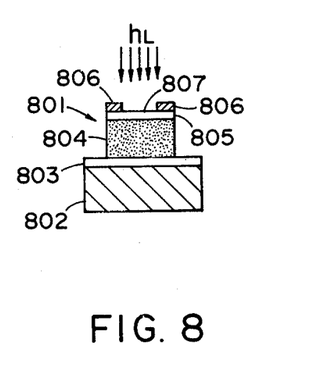

FIG. 8 shows a modified embodiment of the photo-electric conversion element 501 of the type as shown in FIG. 5. In the photo-electric conversion element 801 shown in FIG. 8, the non-light-transmissive metal layer 806 is provided on the surface of the electrode 805 which is to become the input side of the light information so as to define the size of the light receiving window 807 as desired. In other aspects, there is no fundamental difference from the photo-electric conversion element shown in FIG. 5.

Figure 9A:
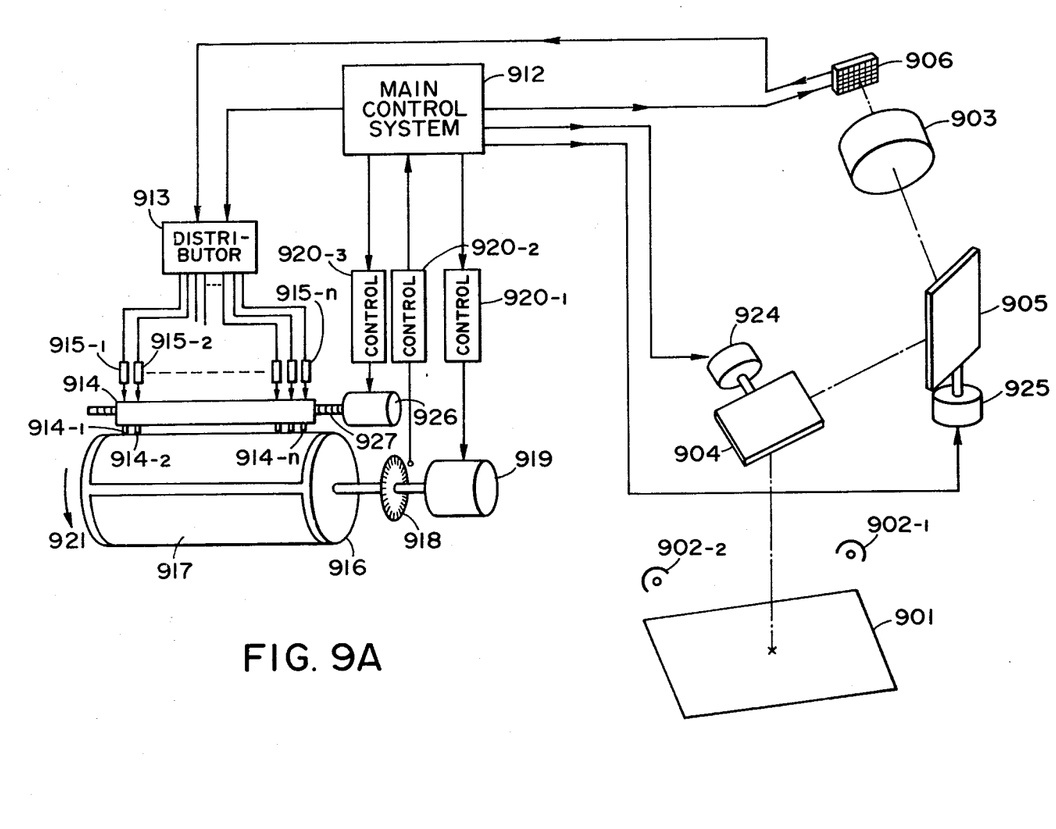
FIG. 9A is a schematic structural diagram showing the overall arrangement of one preferred embodiment of the image forming apparatus incorporating therein the photo-electric converter according to the present invention.

Referring to FIG. 9A, explanations will be made as to one embodiment of an image forming apparatus incorporating therein the photo-electric converter according to the present invention.

In the drawing, a reference numeral 901 refers to an image original and reference numerals 902-1, 902-2 designate illuminating light sources. A scale-reduced image is formed on the light receiving surface of the photo-electric converter 906 by an optical system consisting of scanning mirrors 904, 905 and an image forming lens system 903. The scanning mirrors 904, 905 are rotatable by respective motors 924, 925, thereby scanning the original image formed on the above-mentioned light receiving surface in both vertical and horizontal directions which are mutually orthogonal on the light receiving surface.

The light receiving surface of the photo-electric converter 906 consists of m×n photo-electric conversion elements in an array, i.e., they are arranged in the horizontal direction for n files (or columns) and in the vertical direction for m ranks (or rows), whereby the original image is formed on substantially the entire light receiving surface. Now, if it is assumed that the number of the required pels to be read from the image original surface be sn in the horizontal direction and tm in the vertical direction, it will become necessary that the above-mentioned divided unit area be further divided into s×t smaller unit areas and that each of those smaller unit areas be read as one pel.

The photo-electric converter 906 contains therein the photo-electric conversion elements arranged for n files in the horizontal direction and m ranks in the vertical direction, and the size of the light receiving window of the photo-electric conversion element is substantially equal to the size of one pel of the image on the original 901 formed on the light receiving surface of the photo-electric converter. When the image original is read with such arrangement, the image original surface will be read out at a sampling point of the m×n image elements. As mentioned above, if it is assumed that the number of the required pels to be read from the image original surface be sn in the horizontal direction and tm in the vertical direction, the reading operation by the above-mentioned photo-electric converter 906 results in the reading at an interval corresponding to the s pels in the horizontal direction and to the t pels in the vertical direction. A relationship between the photo-electric conversion element 907 and one element image 908 on the image original 901 on the light receiving surface of the two-dimensional photo-electric converter 906, in this instance, is shown in FIG. 9B.

Figure 9B:
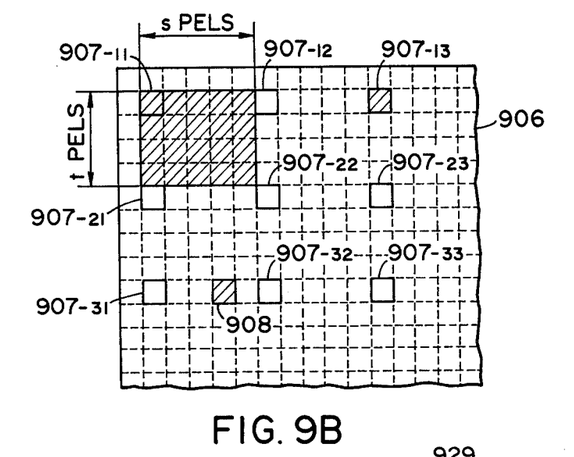
FIG. 9B is an explanatory diagram indicating a relationship between the photo-electric conversion element 907 on the light receiving surface of the photo-electric converter 906 and a single element image 908 of an image original 901.

Signals of m×n pels of the first element image shown in FIG. 9B as read by the photo-electric converter 906 are sequentially read out and forwarded to a distributor 913. Here, in order to facilitate understanding of the explanations with respect to the operations of the apparatus shown in FIG. 9A, brief explanations will be given as to the read-out mechanism of the photo-electric converter according to the present invention in reference to FIG. 9C, wherein a part of the construction of the photo-electric converter 906 is illustrated schematically.

Figure 9C:
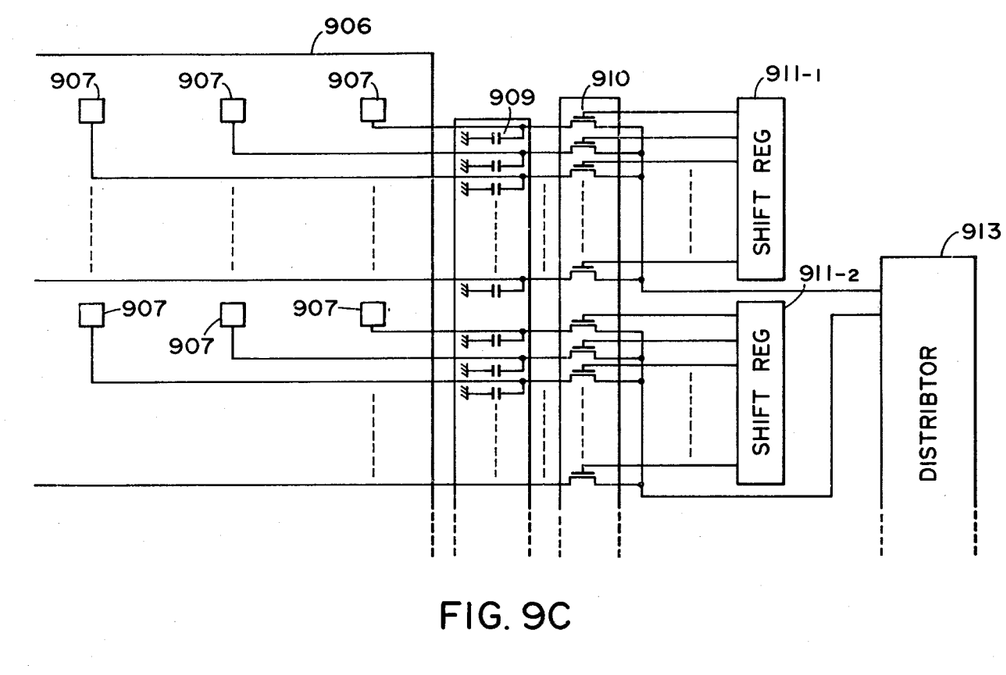
FIG. 9C is a schematic block diagram showing a part of the construction of the photo-electric converter 906.

The photo-electric converter 906 is constructed with a photo-electric conversion section consisting of a plurality of photo-electric conversion elements 907, each having a light receiving window, and a signal processing circuit section comprising an accumulating section 909, a switching element section 910, and a shift register section 911. The accumulating section 909 contains accumulating capacitors which are the same in number as the m×n photo-electric conversion elements in the photo-electric conversion section. The pel signal which is photo-electrically converted at the photo-electric conversion section is accumulated in this accumulating section 909.

The pel signals (consisting of n bits) for one rank (horizontal direction) of the accumulated signals are sequentially read out by transfer clocks supplied from a main control system 912 through the shift register section 911.

The signals are then distributed sequentially by the distributor 913 into the drive systems 915-1, 915-2, ..., 915-n of a recording head 914 for each pel signal. The recording head 914 faces a recording paper sheet 917 set on a drum 916. In this recording head 914, n ink jet nozzles 914-1, 914-2, ...., 914-n are regularly arranged on a rectilinear line with a space interval between them in correspondence with the s pels of the image to be recorded, and each of these ink jet nozzles is driven by a corresponding driving system. It should be noted here that the size of one image element of the image for recording differs from the size of one pel of the image original depending on magnification for the recording.

While pel signals for one rank (horizontal direction) are being recorded on the recording paper through the ink jet nozzles 914-1, 914-2, ..., 914-n, the drum 916 is rotated at a constant speed by the motor 919 so as to relatively displace for the t pels of the recording image with respect to the first nozzle 914-1. In this state, the pel signals for the second rank in the accumulating section 909 are read out, and signals are sequentially applied to the ink jet nozzles 914-1, ..., 914-n in the same manner as in the pel signals for the first rank, thereby performing the recording of the signals for the second rank. By repeating this operation sequentially for m times during one rotation of the drum, the m ranks of the first element image are recorded.

In the apparatus shown in FIG. 9A, the scanning mirror 904 which performs the vertical scanning of the original image on the light receiving surface of the photo-electric converter 906 finely changes its angle of inclination by the motor 924 which is controlled by the main control system 912, and shifts the original image on the light receiving surface of the photo-electric converter 906 for one pel during one rotation of the drum 916. As the consequence of this, at the time instant when the first element image has completed its recording during one rotation of the drum 916, the image signals of the second element image which have been shifted for one pel in the vertical direction are transferred to the accumulating section 909, whereby reading of the second element image signals becomes feasible.

Reading of the second element image signals will be commenced when the drum 916 performs its one rotation, and the first nozzle 914-1 arrives at a position advanced by one pel from the position where the first element image is recorded, and recording thereof is performed simultaneously as is the case with the first element image.

This recording start signal is obtained from a rotary encoder 918 which is directly connected with the drum 916. In other words, one reference pulse is generated from this rotary encoder 918 at every one rotation of the drum 916. This pulse signal enters into the control system 912 through an auxiliary control system 920-2 to be rendered a signal for starting the element image recording. At the time of recording the Nth element image in the vertical direction, the pel signal clock is counted for a number (N−1) after the above-mentioned pulse signal has been introduced as an input. Thereafter, the recording start signal is applied to the shift register section 911 and the recording control system 912.

Figure 9D:
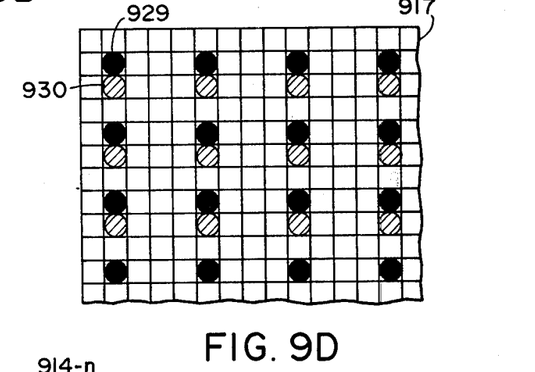
FIG. 9D is an explanatory diagram indicating a recorded state of the first element image 929 and the second element image 930.

FIG. 9D shows a state wherein the first element image 929 and the second element image 930 are recorded. Further, the synchronous signals for reading and writing of the pel signals for each rank can be obtained from the rotary encoder 918.

Thus, by sequentially recording the element images of t sheets of the image originals on one and the same recording sheet there can be attained the recording of the image, in which the pels are closely arranged in the vertical direction. Incidentally, the scanning mirror 904 performs one vertical scanning of the image original in the vertical image recording. That is, one scanning completes with a t rotation of the drum 916, the scanning width of which stands for a quantity to shift the original image on the light receiving surface of the photo-electric converter 906 by t pels.

Figure 9E:
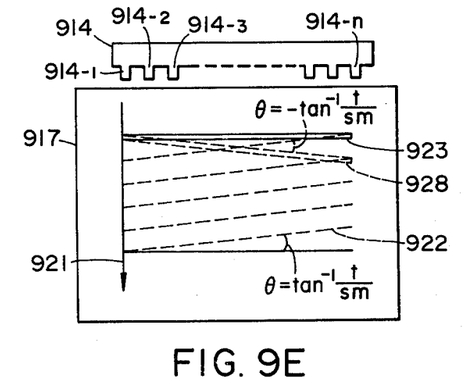
FIG. 9E is an explanatory diagram showing a positional relationship between the recording head 914 and the drum 917.

Even at the time of recording as shown in FIG. 9E, when the recording head 914 is disposed at a position 923 perpendicular to the rotational direction 921 of the drum 916, the recorded image 922 for one rank will be on a line which is inclined by an angle $\theta = \tan^{-1}(t/sm)$ at the completion of the writing operation. To avoid this, the recording head 914 is disposed at a position 928 having an angle of inclination $\theta = -\tan^{-1}(t/sm)$ with respect to the rotational direction 921 of the drum, instead of the position 923, whereby the pel signal for one rank is recorded on the recording line perpendicular to the rotational direction 921 of the drum.

In the above-described manner, the vertical scanning can be effected. Similarly, the horizontal scanning can be performed by the scanning mirror 905 controlled by the motor 925 on the light receiving surface of the photo-electric converter 906 at every t rotations of the drum 916 and at a pitch speed of one pel. Also, the recording head 914 is shifted in the direction of the drum at the same pel pitch speed by a forwarding screw member 927 rotated by the motor 926. In this consequence, as soon as the recording of the first step for the t element images in the vertical direction is completed, the recording of the t element images in the subsequent second step which is horizontally moving for one pel starts under the control of the control system 912. Thus, when the scanning and recording operations have been completed for s steps, an image consisting of sm×tn pels is perfectly recorded on the recording paper 917.

The vertical scanning of the original image by the scanning mirror 904, the horizontal scanning of the original image by the scanning mirror 905, and the horizontal scanning of the recording image by the recording head 914 may be done either by a non-continuous step forwarding or a continuous forwarding, although the latter is preferable from the technical standpoint.

In the following, a relationship between the vertical and horizontal scannings by this apparatus will be discussed. When the reading clock frequency of the two-dimensional photo-electric converter 906 is $f_c$ sec, the repetition rate $f_R$ of the recording head 914 is equal to the quantity $f_c/m$, and the rotational speed of the drum is then $f_c/mn \times 60$ rpm. In case the scanning mirrors 904, 905 perform the stepping rotation, the step frequencies become $f_c/tmn$ and $f_c/tsmn$, respectively. Accordingly, the recording time period T of one sheet of the image original is represented by $T = tsmn/f_c$ sec.

Now, as one example, if the following parameters are given for each of the terms: m=192; n=139; t=s=18; and $f_c$=2.88 MHz, the following results are obtained.
 (a) Number of recording pels: 3456×2502
 (b) Recording time period: 3 seconds
 (c) Rotational speed of the drum: 6400 rpm
 (d) Frequency of the recording head: 15 KHz
 (e) Stepping frequency of the scanning mirror 904: 6.00 Hz
 (f) Stepping frequency of the scanning mirror 905: 0.333 Hz Further, if it is assumed that the image original for recording and reading is in A-4 size (297 mm in width×210 mm in length), and the image forming magnification of the image forming lens system 903 is 0.95, the pel pitch on the surface of the image original is 83.3 μm, while the pel pitch on the light receiving surface of the two-dimensional photo-electric converter 906 is 79 μm. Also, the size of the photo-electric conversion element is of an order of 79×79 μm. Accordingly, if the two-dimensional photo-electric converter having the photo-electric conversion element pitch of 1.44 mm and the photo-electric conversion element number 192×139 is used, high image quality reading can be done according to the present embodiment. Incidentally, when the light receiving window of the two-dimensional photo-electric converter is not accurately patterned, a mask with small openings being arranged at a predetermined spacing may be directly contacted and adhered onto the light receiving surface.

As stated in the foregoing, when the two-dimensional photo-electric converter, in which each and every photo-electric conversion element has a photo-sensitive region (light receiving window) corresponding to one pel, is used, it will become feasible that, instead of using the scanning mirrors 904, 905 for shifting a relative position between the original image and the two-dimensional photo-electric converter, such original image is fixedly mounted and the photo-electric converter is subjected to the step-forwarding by s steps in the horizontal direction and by t steps in the vertical direction.

As having been apparent from the foregoing explanations, the present invention is to provide the photo-electric converter of an improved system, wherein an original image is read by sampling through the two-dimensional photo-sensor, then the pel signal thus obtained is written at a position where the pel signal has been sampled by means of the writing head with a plurality of writing elements being arranged therein, and, at the time of the reading and writing, the relative position of the original image to the two-dimensional photo-sensor and the relative position of the writing head to the writing member are sequentially moved with interpolation made, thereby performing high image quality writing of the original image.

What we claim is:

1. A photo-electric converter, comprising:

(a) photo-electric conversion means comprising m×n photo-electric conversion elements, each element being constructed with a layer of light receiving material and two electrodes and having a light receiving window which defines a pel, said elements being arranged two-dimensionally in an array of m ranks and n files, wherein the light receiving windows of said photo-electric conversion elements constituting a rank are arranged at a pitch of an integral number s of pels and the light receiving windows of said photo-electric conversion elements constituting a file are arranged at a pitch of an integral number t of pels;

(b) means for stepwise reading an original image at a resolution of s×n pels in the horizontal direction and t×m pels in the vertical direction and for forming s×t partial images on said m×n photo-electric conversion elements by performing original image reading at s steps of one pel in the horizontal direction and at t steps of one pel in the vertical direction; and (c) signal processing circuitry to process the s×t partial images which have been subjected to photo-electric conversion in said photo-electric conversion means.

2. The photo-electric converter as set forth in claim 1, wherein said light receiving body layer forms a heterojunction with one of said electrodes at a light incidence side, and an ohmic contact with the other electrode.

3. The photo-electric converter as set forth in claim 1, wherein said light receiving body layer is constructed with a photo-conductive material selected from a group consisting of hydrogenated amorphous silicon, Se, SeTe, and PbO.

* * * * *